United States Patent
Corbin, Jr. et al.

(10) Patent No.: US 7,119,433 B2
(45) Date of Patent: Oct. 10, 2006

(54) PACKAGING FOR ENHANCED THERMAL AND STRUCTURAL PERFORMANCE OF ELECTRONIC CHIP MODULES

(75) Inventors: John S. Corbin, Jr., Austin, TX (US); Gary F. Goth, Pleasant Valley, NY (US); Dales M. Kent, Round Rock, TX (US); William P. Kostenko, Poughkeepsie, NY (US); Roger R. Schmidt, Poughkeepsie, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/869,524

(22) Filed: Jun. 16, 2004

(65) Prior Publication Data

US 2005/0280140 A1    Dec. 22, 2005

(51) Int. Cl.
*H01L 23/34*    (2006.01)
*H01L 23/12*    (2006.01)

(52) U.S. Cl. ............... 257/706; 257/704; 257/E23.103

(58) Field of Classification Search ............... 257/704, 257/706
See application file for complete search history.

(56) References Cited

U.S. PATENT DOCUMENTS

| | | | |
|---|---|---|---|
| 5,819,402 A | 10/1998 | Edwards et al. | 29/840 |
| 5,821,161 A | 10/1998 | Covell, II et al. | 438/613 |
| 5,838,064 A * | 11/1998 | Shimada et al. | 257/718 |
| 5,881,944 A | 3/1999 | Edwards et al. | 228/56.3 |
| 5,956,576 A * | 9/1999 | Toy et al. | 438/125 |
| 5,969,949 A | 10/1999 | Kim et al. | 361/704 |
| 5,982,038 A | 11/1999 | Toy et al. | 257/772 |
| 6,297,549 B1 * | 10/2001 | Hiyoshi | 257/703 |
| 6,320,257 B1 | 11/2001 | Jayaraj et al. | 257/723 |
| 6,421,244 B1 * | 7/2002 | Shinohara et al. | 361/736 |
| 6,512,674 B1 | 1/2003 | Tozawa | 361/704 |
| 6,590,269 B1 * | 7/2003 | Chuang et al. | 257/432 |
| 6,633,489 B1 | 10/2003 | Callahan et al. | 361/771 |
| 6,637,506 B1 | 10/2003 | Gektin et al. | 165/185 |
| 6,800,931 B1 * | 10/2004 | Tsuda | 257/706 |
| 6,844,621 B1 * | 1/2005 | Morozumi et al. | 257/700 |
| 6,936,919 B1 * | 8/2005 | Chuang et al. | 257/717 |
| 2003/0011064 A1 * | 1/2003 | Combs et al. | 257/706 |
| 2003/0168203 A1 | 9/2003 | Gektin et al. | 165/80.3 |
| 2006/0012032 A1 * | 1/2006 | Paulus et al. | 257/706 |

* cited by examiner

*Primary Examiner*—Nathan J. Flynn
*Assistant Examiner*—Benjamin P. Sandvik
(74) *Attorney, Agent, or Firm*—Lily Neff; Cantor Colburn LLP

(57) ABSTRACT

In an integrated circuit packaging structure, such as in a SCM, DCM, or MCM, a method and apparatus for increasing heat spreader size and thus thermal performance is disclosed. The packaging structure includes a first substrate; an electronic device operably coupled to a top surface defining the first substrate; a heat spreader having a first surface operably coupled to a top surface defining the electronic device and an opposite second surface in thermal communication with a second substrate; and a frame defining an opening therethrough. The frame is further defined by an inwardly extending ledge configured to allow the heat spreader to extend at least to a peripheral edge defining a perimeter of the first substrate. In an exemplary embodiment, the second substrate includes one of a heat sink, cooling plate, thermal spreader, heat pipe, thermal hat, package lid, or other cooling member.

13 Claims, 5 Drawing Sheets

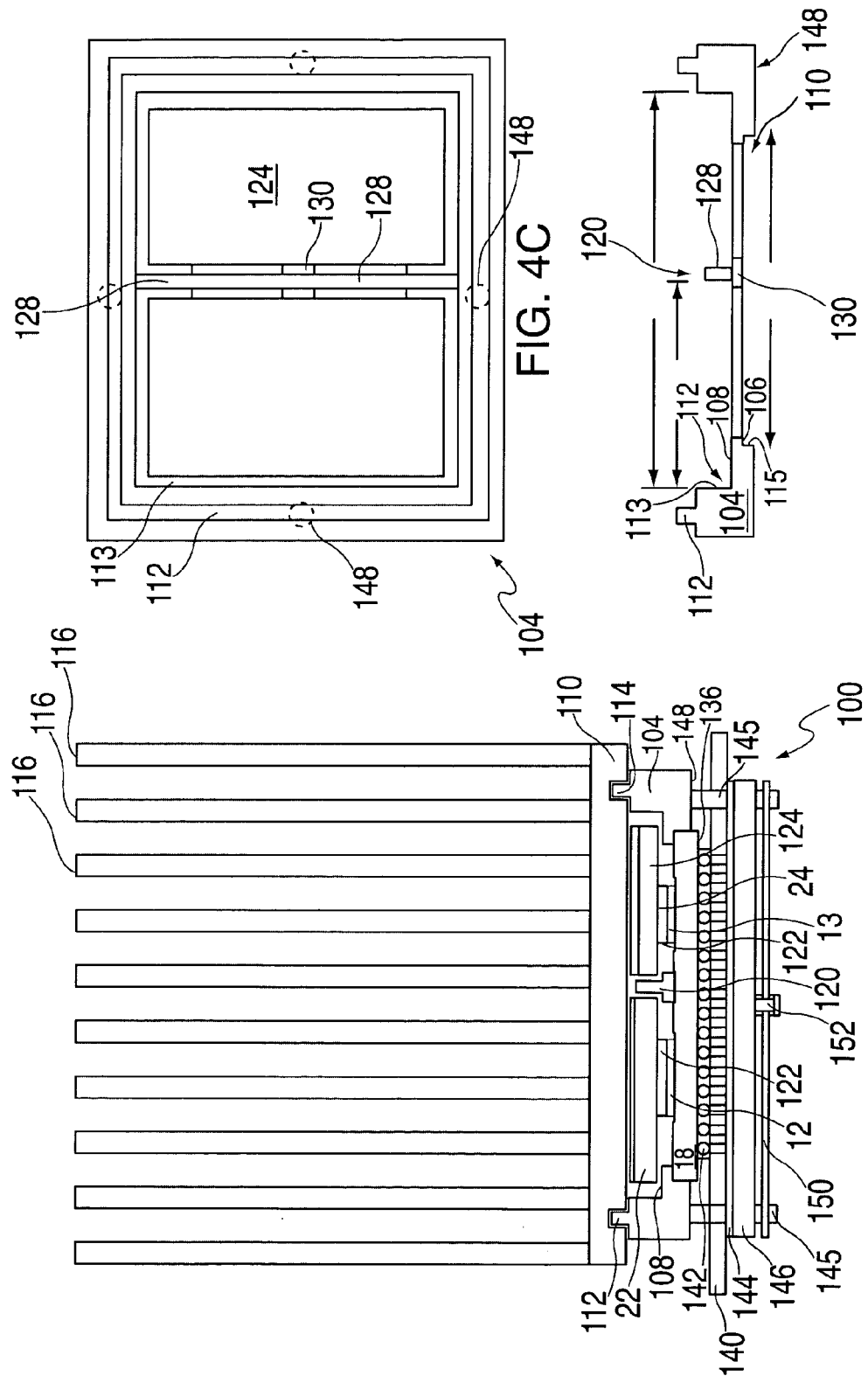

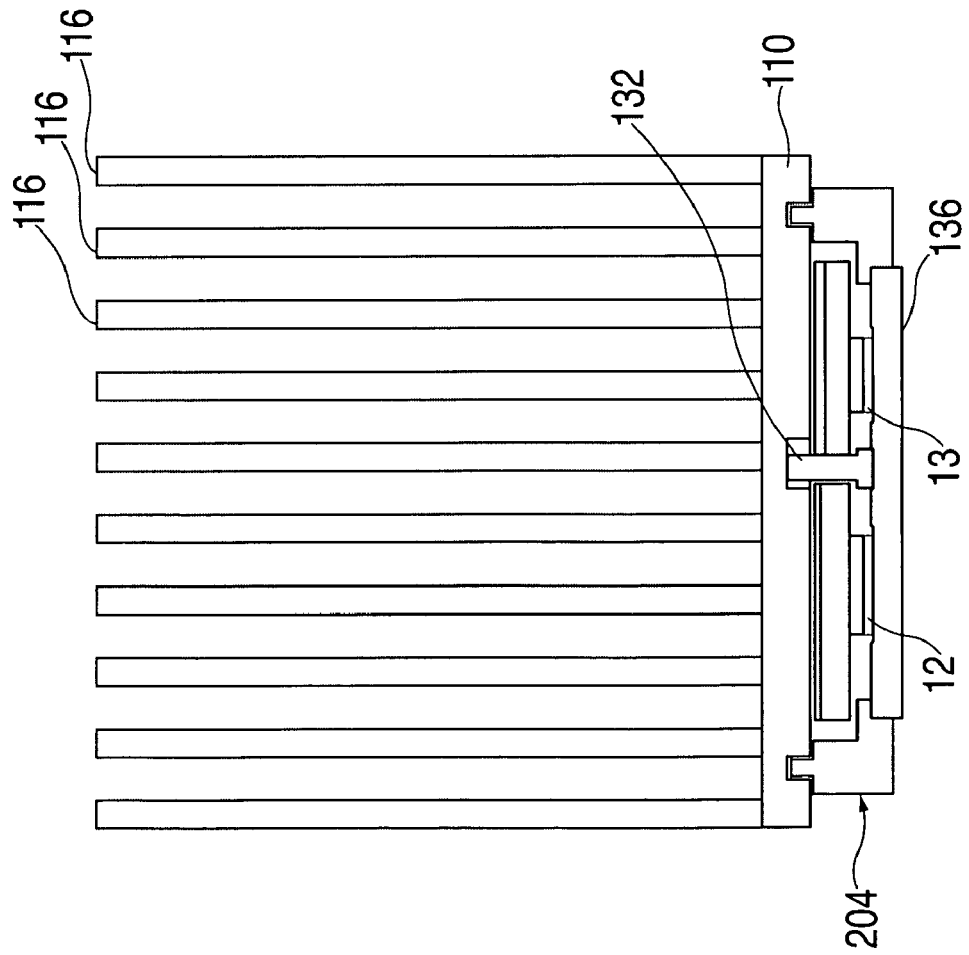

PACKAGING FOR ENHANCED THERMAL AND STRUCTURAL PERFORMANCE OF ELECTRONIC CHIP MODULES

BACKGROUND OF THE INVENTION

This disclosure relates generally to enhanced thermal and structural performance within integrated circuit (IC) packaging structures. More particularly, the present disclosure is directed to the cooling of integrated circuit chips using a heat sink providing heat sink to module strain relief and thermal performance enhancement.

As heat is generated during the functioning of integrated circuit chips (ICs), the thermal resistance to the heat sink ($R_{int}$) must be small so that the operating temperature of the chip is low enough to assure the continued reliable operation of the device. The problem of heat removal becomes more difficult as chip geometries are scaled down and operating speeds are increased, resulting in increased power density. The ability to adequately cool the chips is therefore a limiting factor in the further increase of system performance. Integrated circuit chips mounted on substrates, and particularly in an array on a substrate such as is found in a single-chip module (SCM), dual-chip module (DCM) or a multi-chip module (MCM), present special cooling difficulties. In an MCM, the chips may be mounted very close together and nearly cover the whole top surface of the MCM. With such an arrangement, it may not be possible to use a heat spreader bonded directly to the back surface of the chips, as is sometimes used for isolated chips, to reduce the heat flux (power/unit area, i.e. W/cm$^2$).

A common technique for removing heat from high-power IC's makes use of a cooling plate or heat sink which is thermally attached to the chips using a compliant thermally conductive material. Heat is removed from the cooling plate or heat sink by methods such as forced air cooling or circulating liquid coolants.

The ever increasing power densities associated with today's processing chips are pushing the "coolability" limits of existing thermal technologies to limit $R_{int}$. In DCM and MCM applications, the module typically is comprised of a one or more electronic chips or components. Balancing the most cost-effective substrate size and CP power density, the designer typically is faced with trade-offs and limitations associated with providing the best electrical & thermal performance possible. In addition, recent developments reveal that substrate sizing is more dependent on bottom-surface input/output (I/O) requirements than top-side component placement restrictions, thereby lending the design to additional approaches to improve $R_{int}$ thermal performance. Typical thermal solution options include flat plate cooling (FPC) and direct-lid-attached/advanced-thermal-interfaces (DLA/ATI). For FPC (both traditional and small-gap-technology versions), two "separable" thermal interfaces are needed to complete the assembly (e.g., one each between the chip and cap, and between the cap and heat sink, respectively). In the case of DLA/ATI, only one "separable" thermal interface is used (heat spreader and heat sink). If a separable thermal interface can be eliminated and the heat spreader size can be made large enough, thermal performance can be enhanced. In the past, FPC and DLA/ATI solutions have been used in combination, but extension of its usefulness has been limited by the modules cap internal dimensions for encapsulating the substrate, thus limiting maximization of the spreader size. In addition to these constraints, high-end DCMs and MCMs typically require high bottom-surface metallurgy (BSM) I/O count and features that allow field replacement. These requirements drive the application of a force-actuated land-grid-array (LGA) interconnect methodology for the assembly of the module to the card assembly. Additionally, the LGA interconnection mechanism is usually targeted for leading edge, high performance modules that generate significant amounts of heat. Thus, thermal performance is important in the LGA interconnection mechanism design.

Accordingly, it is desired to address the effects of the electrical, thermal and mechanical requirements with an apparatus and method that resolves the coupled dimensional constraints so that an optimized system can be produced.

SUMMARY OF THE INVENTION

The shortcomings of the prior art are overcome and additional advantages are provided through the provision of a packaging structure including a first substrate; an electronic device operably coupled to a top surface defining the first substrate; a heat spreader having a first surface operably coupled to a top surface defining the electronic device and an opposite second surface in thermal communication with a second substrate; and a frame defining an opening therethrough. The frame is further defined by an inwardly extending ledge configured to allow the heat spreader to extend at least to a peripheral edge defining a perimeter of the first substrate. In an exemplary embodiment, the second substrate includes one of a heat sink, cooling plate, thermal spreader, heat pipe, thermal hat, package lid, or other cooling member.

In another embodiment, a method of packaging an electronic device is disclosed. The method includes operably coupling an electronic device to a top surface defining the first substrate; operably coupling a heat spreader having a first surface to a top surface defining the electronic device and a second surface opposite the first surface in thermal communication with a second substrate; and operably coupling a frame between the first and seconds substrates, the frame defining an opening therethrough, the frame further defined by an inwardly extending ledge, the ledge configured to allow the heat spreader to extend at least to a peripheral edge defining a perimeter of the first substrate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 4(a) is cross section view of a dual chip module (DCM) including an electronic device having an open load frame and integral bearing pedestal interface between a heat sink and a substrate upon which the electronic device is operably coupled in accordance with an exemplary embodiment of the invention.

FIG. 4(b) is an enlarged cross section view of an exemplary embodiment of the load frame having the integral pedestal of FIG. 4(a).

FIG. 4(c) is a top plan view of the load frame of FIG. 4(b) illustrating CP and L3 heat spreaders disposed in corresponding cavities defined thereby in accordance with an exemplary embodiment.

FIG. 5 is cross section view of a dual chip module (DCM) including an electronic device having an open load frame and spar interface between a heat sink and a substrate upon which the electronic device is operably coupled in accordance with another exemplary embodiment of the invention.

The detailed description explains the preferred embodiments of the invention, together with advantages and features, by way of example with reference to the drawings.

DETAILED DESCRIPTION OF THE INVENTION

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 2:
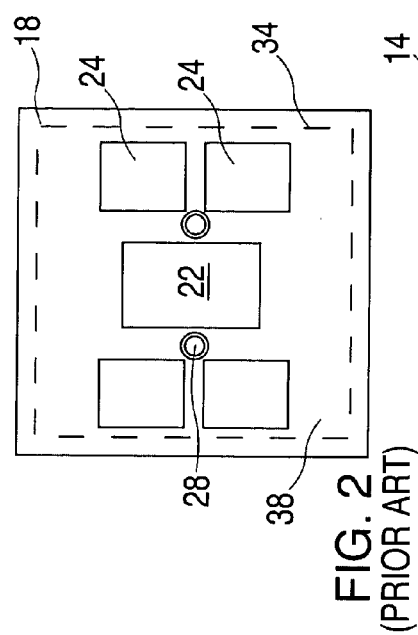
FIG. 2 is top plan view of the substrate having the electronic device coupled thereto of FIG. 1
Figure 3:
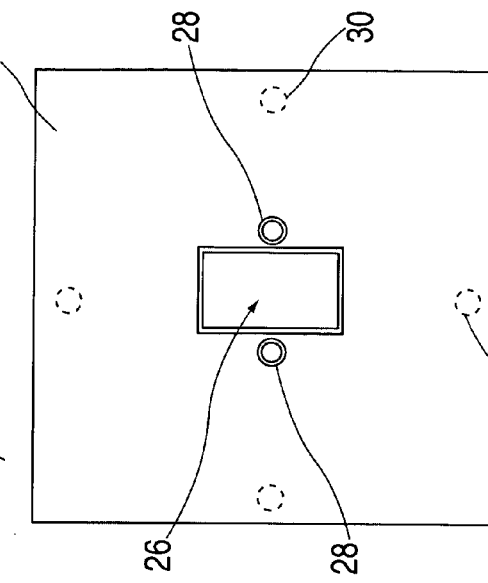
FIG. 3 is a top plan view of the cap of FIG. 1 illustrating a piston and a pair of spars or mechanical couplings between the substrate and cap.
Figure 1:
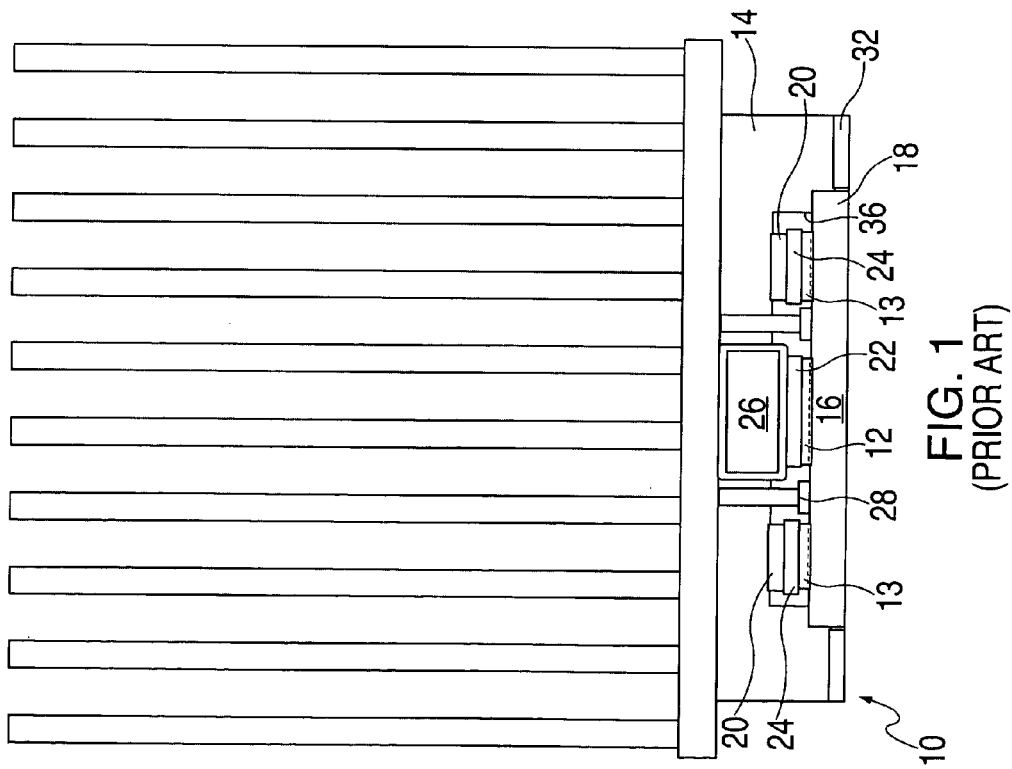
FIG. 1 is cross section view of a multi-chip module (MCM) including an electronic device having a conventional cap interface between a heat sink and a substrate upon which the electronic device is operably coupled.

Referring now to FIGS. 1–3, a conventional semiconductor package structure 10 is illustrated. Structure 10 includes an electronic chip 12 and one or more memory chips (L3) that are in thermal communication with a "hat" or first substrate 14 on one surface, while an opposite surface is operably connected to a C4 array 16 for connection to a second substrate 18. Substrate 14 is a heat sink, cold plate, or other suitable cooling means, or a lid, or heat pipe, or other intermediate structure which is in contact with a suitable cooling means, as is illustrated in FIG. 1. The main thermal dissipation path from chips 12, 13 include a thermal interface material (TIM) or thermal paste layer 20 which provides mechanical compliance and provides stress relief, between a corresponding heat spreader 22 and 24 for chips 12 and 13, respectively, and substrate 18 or thermal cap/heat sink 14. The type of paste described in U.S. Pat. No. 5,098,609 can be used in the present invention, as can other compliant thermally conductive pastes used in the art or other compliant conformable thermally conductive materials. Furthermore, it is noted that chip 12 includes a piston 26 extending from a copper cap or lid 14 as well as a pair of spar mechanical support members 28. A spar is a mechanical coupling between a substrate and secondary structural member designed to limit the deformation response of the substrate under LGA loading.

Still referring to FIGS. 1–3, copper (Cu) cap 14 includes four clearance holes 30 for attaching a traditional mechanical structure for an LGA (not shown) to the MCM depicted in FIG. 1. The assembly of FIG. 1 encapsulates substrate 18 with Cu cap 14 and a stainless base ring 32. The LGA actuation hardware (not shown) interfaces to the Cu cap 14 and is predominately housed below a surface of a printed circuit board (PCB) (not shown).

Traditionally, the chip thermal interfaces are limited to the area between adjacent mechanical support members (i.e., spar mechanical support members) and/or adjacent chips 13. FIG. 2 illustrates an interface between CU cap 14 and substrate 18 via a phantom line 34 proximate a periphery defining substrate 18. In this manner, it can be seen that sizing of heat spreaders 22 and 24 are limited in that they can not extend outside or beyond phantom line 34. In other words, edges defining heat spreaders 22 and 24 cannot extend at least to a periphery defining substrate 18 and can only extend to phantom line 34, because of a wall 36 defining a perimeter of a cavity 38 defined by cap 14.

Referring now to FIGS. 4a–4c, an exemplary embodiment of an electronic device package is generally illustrated at 100. Electronic package 100 is a DCM including chips 12 and 13 attached to substrate 18 as described with reference to the MCM depicted in FIG. 1. One embodiment of a frame 104 is attached to an edge and peripheral top surface defining substrate 18 via a first shoulder 106 defined by a ledge 108 extending inwardly to define an opening 110 therethrough as best seen with reference to FIG. 4b. The open frame 104 is rectangular corresponding to a shape of substrate 18. Ledge 108 also defines a second shoulder 112 opposite first shoulder 106. Second shoulder 112 is defined by a second wall 113 transverse to inwardly extending ledge 108. Second wall 113 is disposed outboard more than a first wall 115 transverse to ledge 108 defining first shoulder 106. The open frame 104 is attached to a heat sink 110 via a rib 112 extending from a top surface defining frame 104 for freely aligning with a groove 114 configured in heat sink 110. The heat sink 110 is envisioned to be constructed using material including copper and/or aluminum with or without vapor chambers or heat pipes, for example, inside of the base, and the like. The heat sink 110 may dissipate heat generated by circuitry present on, for example, the chips 12 and 13.

Heat sink 110, is secured to frame 104, using a heat sink adhesive, which provides an efficient heat transfer path via the heat sink adhesive to the heat sink 110. The heat sink 110 could have one or more fins 116. However, the heat sink 110, is optionally a heat spreader, as is known in the pertinent art.

A "loose fitting" tongue and groove attachment approach of the heat sink 110 to the frame 104 addresses the tolerance stack up issues associated with the dimensional variations that accumulates with the various elements of the overall assembly. In this case, the heat sink 110 is epoxy attached to the frame with sufficient x-, y-, and z-axis clearances to ensure satisfactory assembly without adversely effecting the heat sink 110 to heat spreader 22, 24 thermal interface requirements. In addition, by "rigidly" attaching the heat sink 110 to the picture frame 104, the dynamic loading effects of heat sink 110 are transferred to the LGA loading hardware discussed below. Also noteworthy is that the height of heat-spreaders 22, 24 integrated pedestal 122 has been increased to facilitate attachment of the frame 104 and allowing an overhang portion 124 of the heat spreaders 22, 24 to extend at least to or over a peripheral edge defining substrate 18. This allows the size of spreader 22, 24 to be adjusted to balance the best compromise among electrical and thermal performance requirements and mechanical needs (i.e., LGA attachment). Incorporating heat spreader materials with highly conductive thermal properties further enhances the spreading of heat generated from the chips 12, 13. Coupled with a conductive spreader medium 20, the large spreader surface area provides substantial reduction of chip temperatures. For those constructions in which mechanical requirements establish a need for separate spars, holes are provided though the spreader to facilitate their attachment directly to the heat sink base, thus allowing substrate loading to be transferred to the heat sink without adversely effecting the chip interfaces.

In one embodiment depicted in FIGS. 4a and 4b, frame 104 includes an integral pedestal 120 bearing on a top surface defining substrate 18 intermediate chips 12 and 13 disposed thereon. Integral pedestal 120 is defined by a leg 128 extending between opposing sides defining frame 104 and a base 130 extending from a portion of leg 126 and bearing on the top surface of substrate 18.

FIG. 4c details a typical picture frame 104 for a rectangular DCM or MCM substrates. For the DCM version of this embodiment, the CP and L3 heat spreader areas are substantially increased. Similar benefits can also be achieved on an MCM version and square substrates as well depicted in FIGS. 6–8, for example.

In another embodiment depicted in FIG. 5, an alternative embodiment of frame 104 in FIGS. 4a and 4b is generally shown at 204. Frame 204 is configured without integral pedestal 120 and uses spar mechanical support members 132 that directly interface to the associated $R_{ext}$ device or second substrate 110 (e.g., heat sink, heat-pipe, etc.), that allows the traditional DLA/ATI thermal solution to be enhanced (e.g., by allowing the heat spreader 124 size to be maximized, beyond the footprint of the substrate 18). A base 134 defining second substrate or heat sink 110 includes cavities aligned with a corresponding SPAR mechanical support member 132 at one end while an opposite end bears against substrate 18.

Referring now again to FIGS. 4a and 4c, a peripheral edge of the TSM (top surface metallurgy) of substrate 18 is epoxy attached to picture frame 104. Substrate 18 is also secured at the BSM (bottom surface metallurgy) area 136, to a mother board or PCB or card 140, via I/O (Input/Output) means 142, such as, for example, pads, pins, etc. The interconnects 142, can be of a Ball Grid Array (BGA), Column Grid Array (CGA), Land Grid Array (LGA), or Pin Grid Array (PGA) type.

In the embodiment depicted in FIG. 4a, interconnects are a LGA where an insulator 144 is intermediate a bottom of card 140 and a stiffener 146. Four loading posts 145 are operably coupled to a bottom of frame 104 via apertures 148 best seen in FIG. 4c. A spring plate 150 having loading screw 152 is operably coupled to an opposite end of the loading posts 145. Loading screw 152 is threadably engaged with fixed load transfer plate 150 and four loading posts 145 such that loading screw 152 biases stiffener 146 toward fixed substrate 18 to maintain the LGA connection via interconnects 142.

The substrate 18 could be an alumina substrate, or a ceramic substrate or an organic substrate. The substrate 18, typically also has a circuitized top surface, which includes circuit lines and electrical contact pads (not shown). However, for ease of understanding all the different types of substrates or modules will be referred to as substrate 18.

Figure 7:
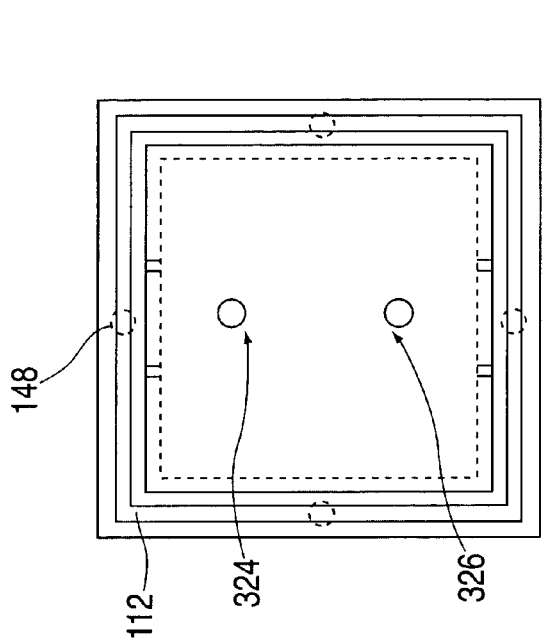
FIG. 7 is a top plan view of the load frame and global heat spreader of FIG. 6 illustrating clearance holes for land grid array (LGA) loading posts (4X) and for the pair of spars.
Figure 8:
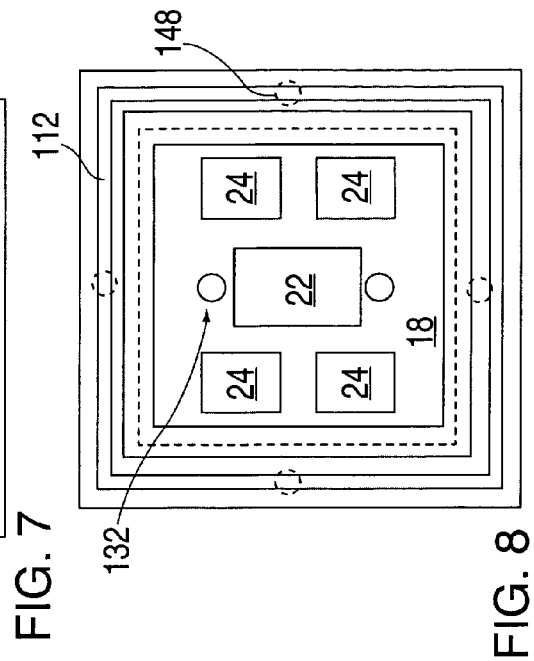
FIG. 8 is a top plan view the load frame of FIG. 7 with the global heat spreader removed illustrating the CP and four L3's operably coupled to the substrate.
Figure 6:
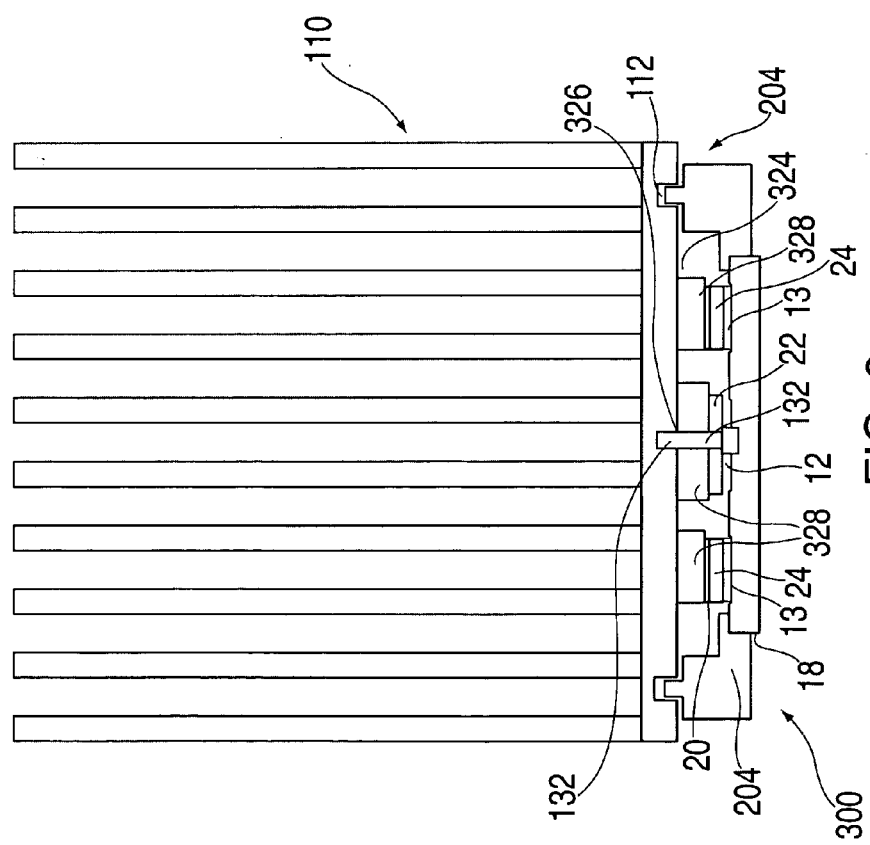
FIG. 6 is an enlarged partial cross section view of a MCM illustrating a global heat spreader disposed in a cavity defined by the load frame with a pair of spars around a CP chip and extending between a heat sink and substrate in accordance with an exemplary embodiment.

Referring now to FIGS. 6–8, an alternative embodiment of a package 300 is illustrated having an MCM (e.g., one CP chip 12 and four L3 chips 13) using frame 204 of FIG. 5 with a pair of spar mechanical support members 132 disposed in front and back of chip 12. Chips 12 and 13, each have a corresponding heat spreader 22, and 24, respectively as described with reference to FIG. 1 and seen in FIG. 8. A single global heat spreader 324 is disposed over the heat spreaders 22 and 24 with a thermal interface material 20 therebetween. Global heat spreader 324 includes apertures 326 configured and aligned to receive SPAR mechanical support members therethrough. Global heat spreader 324 further includes heat spreader interface pedestals 328 extending therefrom aligned with a corresponding heat spreader 22, 24. Heat spreader interface pedestals 328 may be integral or separable of global heat spreader 324.

Figure 9:
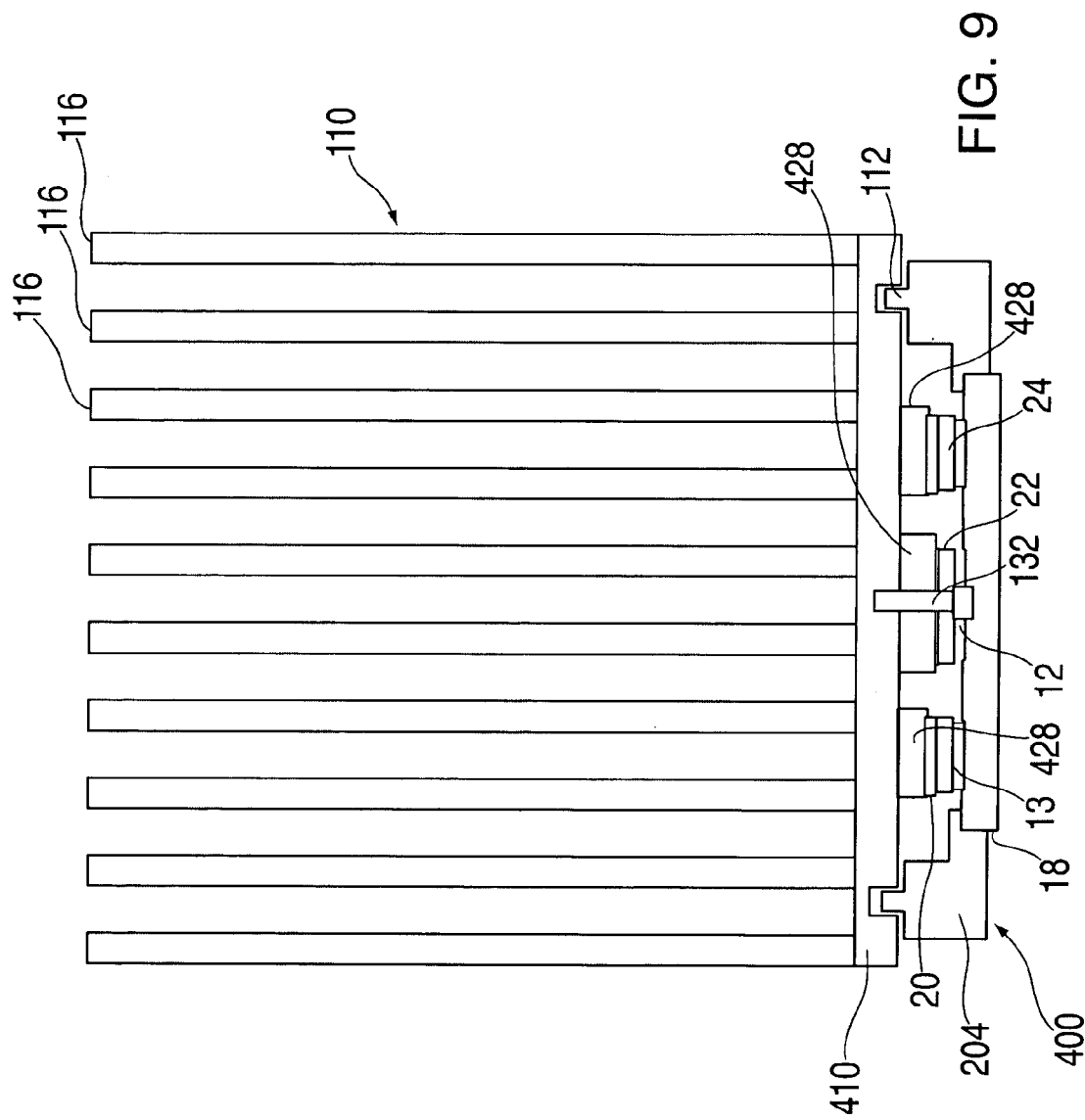
FIG. 9 is the MCM of FIG. 6 having a heat sink configured with integral chip interface pedestals extending therefrom in thermal communication with the CP and L3's instead of the global heat spreader of FIG. 8 in accordance with another exemplary embodiment.

Referring now to FIG. 9, another alternative embodiment of a package 400 is illustrated having an MCM (e.g., one CP chip 12 and four L3 chips 13) using frame 204 of FIG. 5 with a pair of spar mechanical support members 132 disposed in front and back of chip 12. Chips 12 and 13, each have a corresponding heat spreader 22, and 24, respectively as described with reference to FIG. 1 and FIG. 8. A base 410 of heat sink 110 is configured with heat sink interface pedestals 428 extending toward corresponding heat spreaders 22 and 24 with a thermal interface material 20 therebetween. Heat sink interface pedestals 428 may be integral or separable of base 410 of heat sink 110.

The above described exemplary embodiments provide the following advantages including a picture frame loading frame that incorporates an integrated pedestal, or alternatively uses spars, to counteract the negative mechanical stress effects to the substrate (due to LGA loading) while utilizing conventional attachment methods to the substrate, for example epoxy adhesion. The picture frame facilitates a "stress-free" attachment of the external heat sink to the module assembly (given the stackup tolerances).

The tongue-in-groove feature between rib 112 and groove 114 allows the heat sink 110 to freely align with the heat spreader surface to a precisely controlled gap, thereby enhancing the thermal performance, while concurrently providing strain relief of the heat sink to the open picture frame. Coupling of the heat sink to the open picture frame as an integrated unit allows the dynamic loading effects of the mass of the heat sink to be supported by the picture frame and its LGA attachment to the card, thus isolating a mass associated with the heat sink. More specifically, the benefit of "pinning" the heat sink base or second substrate to the load frame helps with heat sink mass isolation in that the heat sink or second substrate couples directly to the load frame, which is itself easier to restrain using techniques known to those skilled in the pertinent art. It will also be noted that this feature also helps center the tongue of the picture frame in the groove of the second substrate and provides a more uniform adhesive thickness around the resulting joint, promoting a more consistent mechanical interface. It is envisionaed that the "pinning" could be achieved by mounting a tooling ball (e.g., a hardened precision sphere with an integral mounting shaft) on one corner of one member and mating it with a hole on the second member. A second tooling ball would interface a slot on the opposite corner of the mating pairs. This spherical engagement would allow the two rotational degrees of freedom required to align the spreader, cap, or integral heat sink (i.e., second substrate) to the CP chip surface, while still coupling the second substrate to the load frame in X-Y.

The surface area of the heat spreader is maximized (e.g., at least to an outline or beyond the footprint of the substrate) to increase the spreading of the heat flux from the chips through a highly conductive material thus improving the thermal performance of the module assembly. Compared to FPC, the open picture frame approach eliminates a thermal interface (spreader to hat) and provides improved gap control and hence improved thermal performance between the spreader and the heat sink. The open picture frame allows the application of spars in lieu of the aforementioned integral pedestals to provide the necessary mechanical support. The open picture frame allows a heat sink with integral pedestals extending therefrom to be employed to maximize thermal performance. The picture frame allows a semi-capped approach to be employed to maximize thermal performance and still support system level burn-in (SLBI) testing requirements. Furthermore, the concept disclosed herein can be utilized in both multilayer ceramic (MLC) and organic single layer carrier (SLC) substrate applications.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An electronic device package comprising:
   a first substrate;
   an electronic device operably coupled to a top surface defining said first substrate;
   a heat spreader having a first surface operably coupled to a top surface defining the electronic device and a second surface opposite said first surface in thermal communication with a second substrate; and
   a frame defining an opening therethrough, said opening dimensioned to contain said heat spreader entirely therein, said frame further defined by an inwardly extending ledge, said ledge configured to allow said heat spreader to extend at least to a peripheral edge defining a perimeter of said first substrate, said ledge operably coupled to at least a top surface defining said first substrate,
   wherein said frame directly interfaces with said second substrate.

2. The package of claim 1, wherein said ledge is configured allowing said heat spreader to extend beyond a footprint defining said first substrate.

3. The package of claim 1, wherein said frame further includes a rib extending therefrom, said rib configured to be received in a complementary configured groove in said second substrate to which said frame is operably coupled, said ledge operably coupled to said top surface defining said first substrate using an adhesive.

4. The package of claim 1, wherein said frame further includes a plurality of apertures therethrough configured to receive LGA loading posts therethrough.

5. The package of claim 1, wherein said frame includes an integral pedestal configured to provide support between said first substrate and said second substrate in said opening, said integral pedestal is defined by a leg extending between opposing sides defining said frame and a base extending from a portion of said leg and bearing on said top surface of said first substrate.

6. The package of claim 5, wherein said integral pedestal is disposed proximate to a side of said electronic device extending through said opening.

7. The package of claim structure of claim 1, wherein said second substrate includes one of a heat sink, a cooling plate, a thermal spreader, a heat pipe, a thermal hat, a package lid, and other cooling member.

8. The package of claim 7, wherein when said second substrate is a heat sink, said heat sink is configured with an integral chip interface pedestal extending therefrom toward said second surface of said heat spreader.

9. The package of claim 3, wherein said second substrate is operably attached to a top surface defining said frame using an adhesive and said rib for freely aligning with said groove.

10. The package of claim 1, wherein said electronic device is one of a SCM, a DCM, and a MCM.

11. The package of claim 1, wherein said inwardly extending ledge defines a first shoulder configured to capture a peripheral portion defining said top surface and said peripheral edge of said first substrate and a second shoulder opposite said first shoulder, said second shoulder defined by a second wall transverse to said ledge being outboard more than a first wall transverse to said ledge defining said first shoulder.

12. The package of claim 1, wherein a single global heat spreader is disposed between said second surface of said heat spreader and said second substrate, said single global heat spreader providing a thermal interface between said second substrate and plurality of heat spreaders each associated with a corresponding electronic device.

13. The package of claim 1, wherein a plurality of spar mechanical support members are disposed proximate to a side of said electronic device extending through said opening and directly interface with said second substrate.

* * * * *